United States Patent

Narita

[11] Patent Number: 5,410,161
[45] Date of Patent: Apr. 25, 1995

[54] SEMICONDUCTOR DEVICE EQUIPPED WITH CHARACTERISTIC CHECKING ELEMENT

[75] Inventor: Yoshitaka Narita, Tokyo, Japan

[73] Assignee: NEC Corporation, Japan

[21] Appl. No.: 911,008

[22] Filed: Jul. 9, 1992

[30] Foreign Application Priority Data

Jul. 12, 1991 [JP] Japan .................................. 3-198382

[51] Int. Cl.6 ..................... H01L 21/38; H01L 21/425
[52] U.S. Cl. .......................................... 257/41; 257/2; 257/390; 257/401
[58] Field of Search ................... 257/202, 390, 401, 41

[56] References Cited

U.S. PATENT DOCUMENTS 4,608,748 9/1986 Noguchi et al. .................... 257/390

Primary Examiner—William L. Sikes
Assistant Examiner—Fetsum Abraham
Attorney, Agent, or Firm—Laff, Whitesel, Conte & Saret, Ltd.

[57] ABSTRACT

Dummy transistors (each composed of a dummy gate electrode and n+-diffused layers) are disposed adjacent to a transistor for characteristic checking which is composed of a gate electrode, n+-diffused layers and aluminum interconnection layers. They are arranged in the same density as that of regular transistors in a product. This decreases a difference in size between the characteristic checking transistor and that in the regular transistors in the product so that the former can be truly representative of the latter.

3 Claims, 4 Drawing Sheets

SEMICONDUCTOR DEVICE EQUIPPED WITH CHARACTERISTIC CHECKING ELEMENT

BACKGROUND OF THE INVENTION (1) Field of the Invention

The present invention relates to a semiconductor device, and more particularly to a semiconductor device having a characteristic checking element in addition to a regular element in the device.

(2) Description of the Prior Art

In the prior art semiconductor device, there was provided on a semiconductor wafer a pattern for checking a contact resistance, a threshold voltage and current-voltage (I-V) characteristics of a transistor so that characteristic variations attributable to fabrication and characteristic abnormalities due to an accident could easily be checked without the need of the P/W check (pellet test at a wafer stage) of a product.

FIG. 1A is a plan view of a prior art MOS transistor for characteristic checking and FIG. 1B is a sectional view thereof taken on line A—A in FIG. 1A. As seen from these figures, the prior art characteristic checking semiconductor device (MOS transistor) has the following configuration. A gate oxide film 3 and a gate electrode 4 are formed in a device region surrounded by a field oxide film 2 on a p-type semiconductor substrate 1, and n+-type diffused layers 6 serving as source/drain regions are formed using the gate electrode 4 as a mask. An interlayer insulating film 7 is formed, and a plurality of contact holes 8 are opened through it. Aluminum (Al) interconnection layers 9 are formed which is kept in contact with the n+-diffused layers 6 and the gate electrode 4, respectively. It should be noted that the Al interconnection layer is not shown in FIG. 1A.

The above prior art characteristic checking transistor (pattern) has the following defect. The gate electrode thereof is independent and isolated and is disposed differently from regular gate electrode patterns in a semiconductor device. For this reason, the gate electrode of the checking transistor pattern, which suffers from the influence of "micro-loading effect" in lithography and etching, has a different resultant size from that of the regular gate electrode within the device. The "micro-loading effect" means that, in patterning, lithography and etching are influenced by the size and density of a pattern area so that the shape and size of the pattern cannot be made uniform.

Thus, the characteristic checking transistor provided for the purpose of monitoring the characteristic of the regular transistor within the device cannot be representative of that characteristic. This presents problems in the controlling of the fabrication process.

SUMMARY OF THE INVENTION

An object of the present invention is to provide a semiconductor device provided with a functional element for characteristic checking which can be truly representative of characteristic of the regular functional element within the device.

In order to attain the above object, the semiconductor device according to the present invention is characterized in that a characteristic checking functional element is provided in addition to the regular functional element, and also at least one dummy functional element of the same kind and shape as the characteristic checking functional element is disposed on each of two sides of the characteristic checking functional element.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1A:
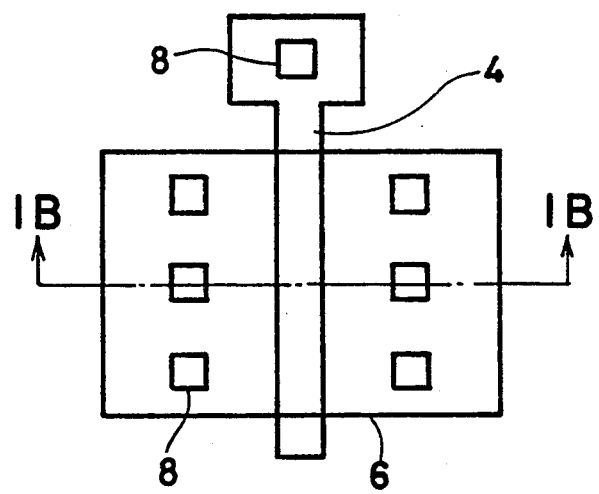
FIGS. 1A and 1B are a plan view and a sectional view of a relevant portion of the semiconductor device of the prior art, respectively.
Figure 1B:
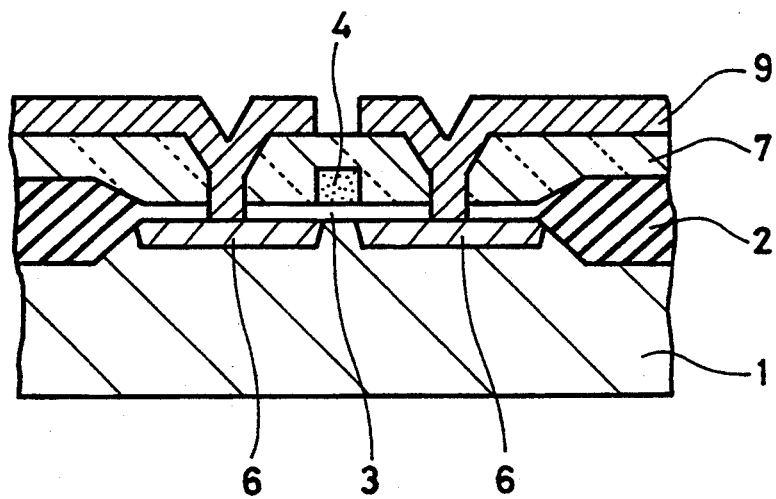

Now, referring to the drawings, an explanation will be given of embodiments of the present invention.

Figure 2A:
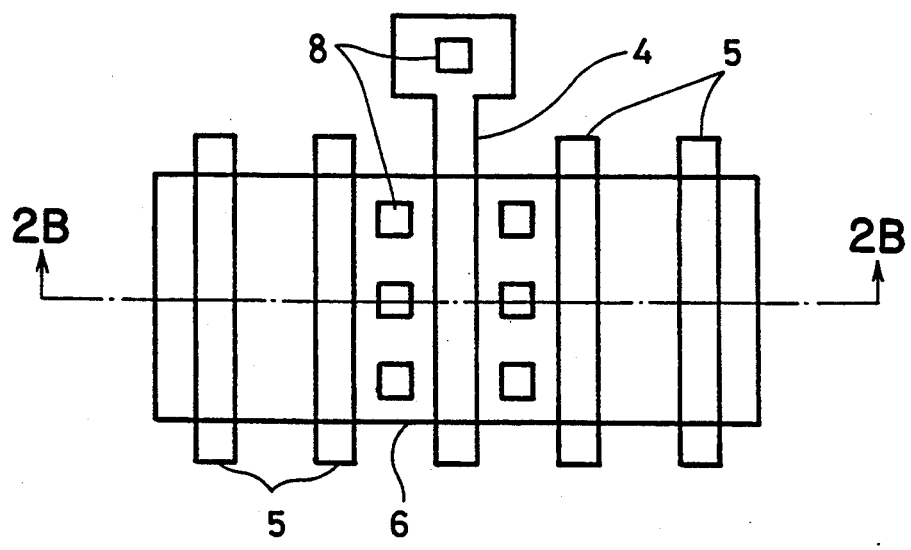
FIGS. 2A and 2B are a plan view and a sectional view of a relevant portion of the semiconductor device of a first embodiment according to the present invention, respectively.
Figure 2B:
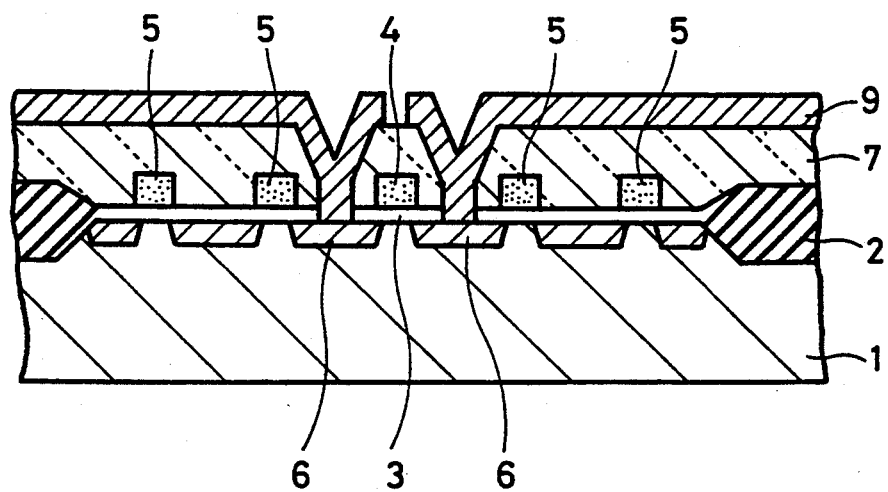

FIGS. 2A illustrates in a plan view a first embodiment of the present invention, and FIG. 2B is a sectional view taken on line B—B of FIG. 2A in which an aluminum interconnection layer 9 is omitted in the illustration.

The semiconductor device shown in these figures includes a p-type semiconductor substrate 1; a fixed oxide layer 2 serving as a device isolating area; a gate oxide film 3; a gate electrode 4; dummy gate electrodes 5; n+-type diffused layers 6 serving as source/drain regions; an interlayer insulating film 7; contact holes 8 formed in the interlayer insulating film 7; aluminum (Al) interconnection layers 9 connected with the gate electrode 4 and the two diffused layers 8.

On both sides of the gate electrode 4, two dummy gates 5 are disposed in parallel to the gate electrode 4, respectively. This is, two dummy transistors are arranged on either side of the gate electrode 4. The dimensions of the gate electrodes of the dummy transistors are a gate length of 1.0 $\mu$m and a gate interval of 2.0 $\mu$m in conformity with the standard minimum values adopted for the regular gate electrode in a product.

In the characteristic checking transistor thus formed, the degree of density (or intervals) of the gate electrodes is equivalent to that in the regular gate electrodes in the product so that the gate length is also substantially equivalent to that in the product. The checking transistor can therefore be representative of the regular element in the product. This enhances the reliability of characteristic checking.

Figure 3A:
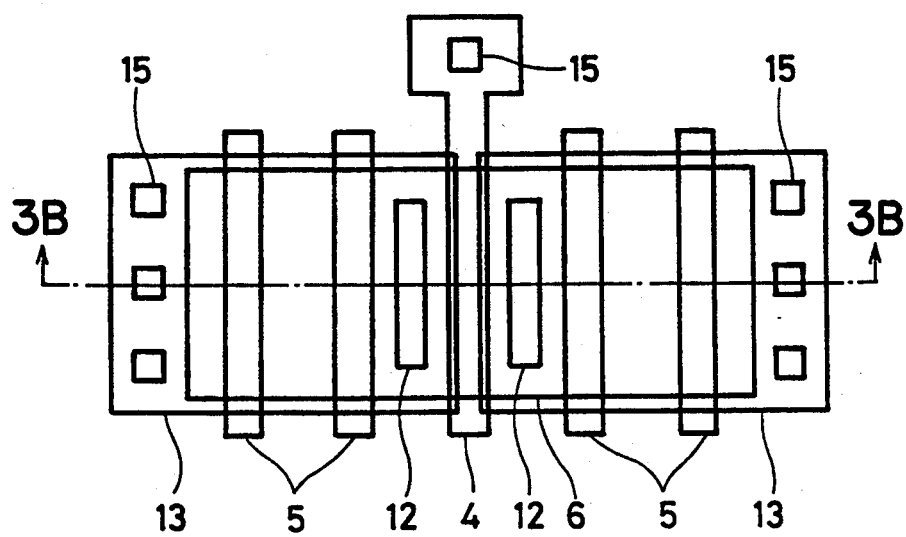
FIGS. 3A and 3B are a plan view and a sectional view of a relevant portion of the semiconductor device of a second embodiment according to the present invention, respectively.
Figure 3B:
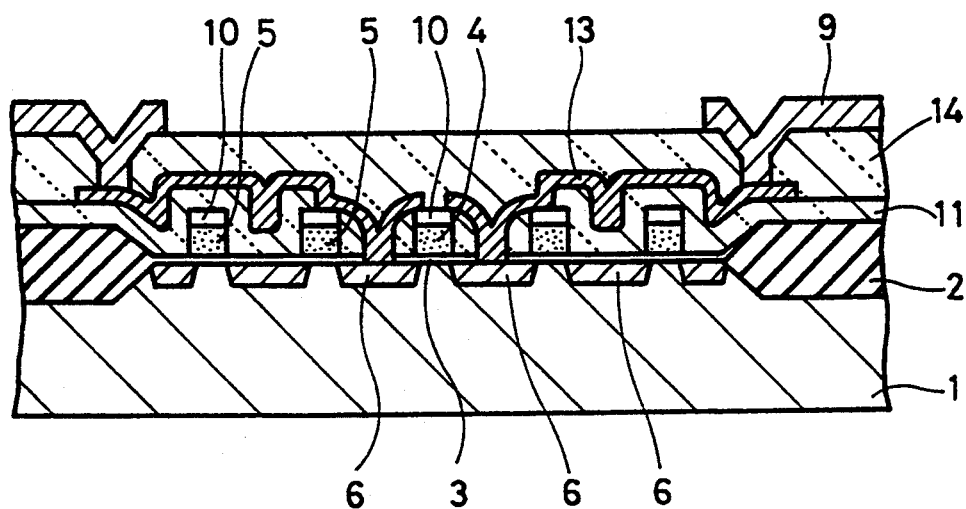

FIG. 3A illustrates in a plan view the second embodiment of the present invention, and FIG. 3B is a sectional view thereof taken on line C—C of FIG. 3A in which an aluminum interconnection layer 9 is not included in the illustration. In these figures, like reference numerals designate like parts in FIGS. 2A and 2B so that a repeated explanation will be avoided for these parts.

In FIGS. 3A and 3B, reference numeral 10 denote silicon oxide films formed on a gate electrode 4 and dummy electrodes 5; 11 a first interlayer insulating film; 12 contact holes self-aligned with the gate electrode 4 and the dummy gate electrodes 5; 13 WSi (tungsten silicide) interconnection layers connected to the source/drain regions 6; 14 a second interlayer insulating film; and 15 contact holes formed in the second interlayer insulating film 14.

Next, with reference to FIG. 4, an explanation will be given of a method for fabricating the semiconductor device according to this second embodiment.

A field oxide film 2 of 5000 Å in thickness serving as a device isolating area is formed on a p-type semiconductor substrate 1 by a well-known selective oxidation method, and thereafter a gate oxide film 3 of 300 Å in thickness is formed on the surface by a thermal oxidation method.

Figure 4A:
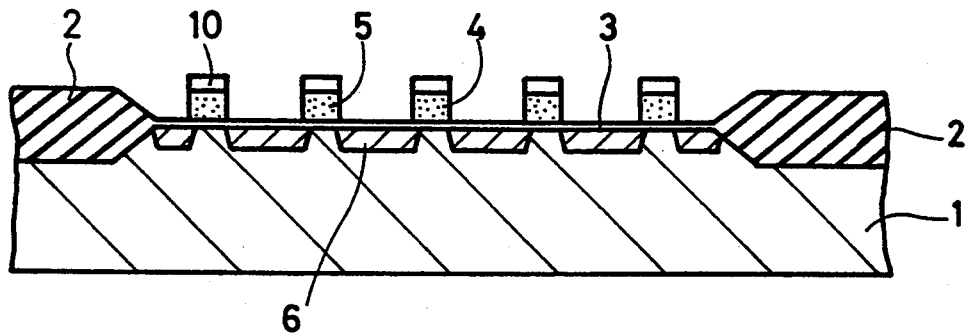
FIGS. 4A to 4D are sectional views of relevant portions of the semiconductor device according to the present invention, illustrating the fabrication process of the device of the second embodiment according to the invention.

Then, a polycrystalline silicon film of 3000 Å in thickness and a silicon oxide film of 1000 Å in thickness are successively deposited by an ordinary CVD (chemical vapor deposition) method, and patterning is carried out by lithography techniques using photoresist to form a gate electrode 4, dummy gate electrodes 5 and silicon oxide films 10 covering these gate electrodes 4 and 5. Thereafter, by ion-implantation using the gate electrode 4 and the dummy gate electrodes 5 as masks, arsenic (As) in a concentration of $1 \times 10^{15}$ cm$^{-2}$ is introduced to form n+-diffused layers 6 (FIG. 4A).

Figure 4B:
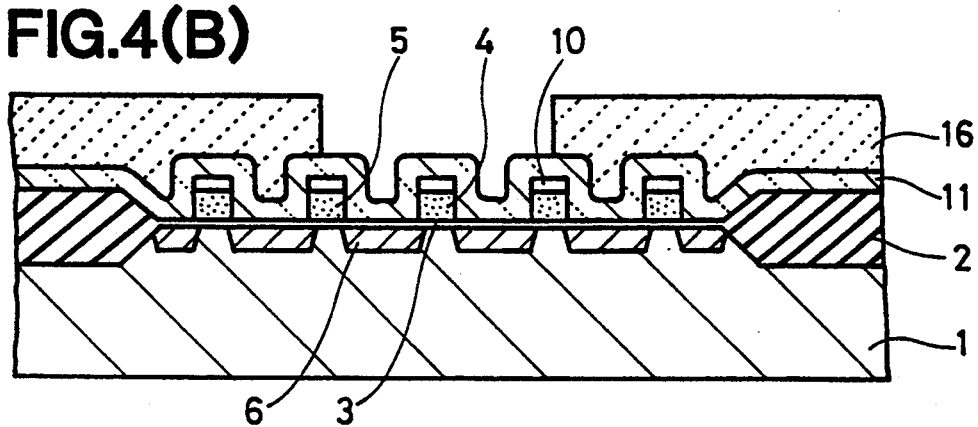

Next, an oxide film is deposited on the entire surface by the CVD method to form a first interlayer insulating film 11. Then, photoresist is applied and a hole of a desired shape is made by the ordinary lithography techniques to form a photoresist mask 16 (FIG. 4B).

Figure 4C:
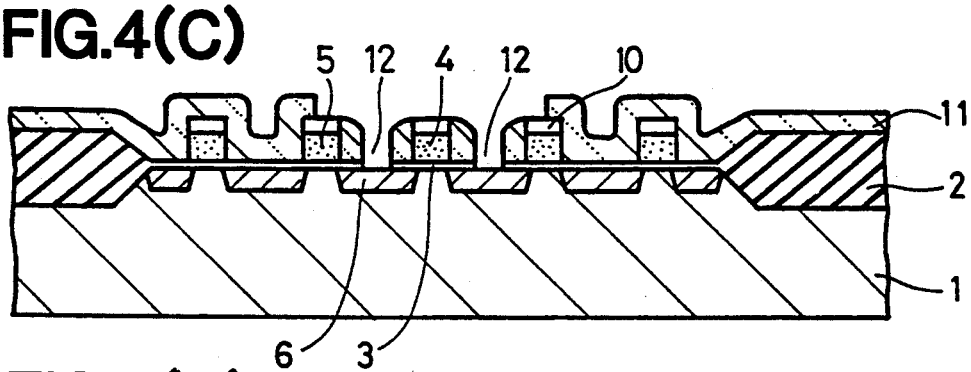

Anisotropic RIE (reactive ion-etching) is performed for the first interlayer insulating film 11 through the photoresist mask 16 to form contact holes 12 self-aligned with the gate electrode 4 and the dummy gate electrodes 5. The photoresist mask 16 is removed thereafter (FIG. 4C).

Figure 4D:
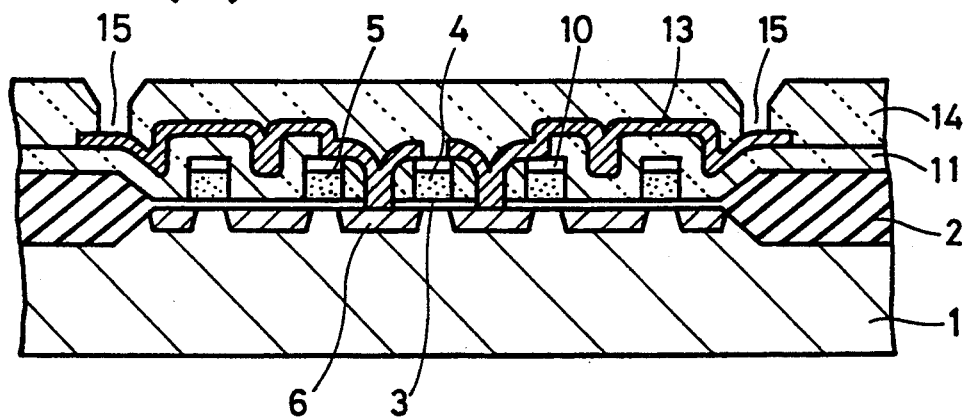

A WSi (tungsten silicide) film of 1000 Å in thickness is deposited by sputtering, and it is patterned to form WSi interconnection layers 13. A second interlayer insulating film 14 is formed by the CVD method and contact holes 15 are opened in the second interlayer insulating film 14 (FIG. 4D).

Subsequently, an aluminum (Al) film is deposited and patterned to complete the semiconductor device according to this second embodiment shown in FIG. 3.

According to this embodiment, the source/drain contacts of the transistor in a product are formed in a self-aligned manner with the gate electrode. The design standard for dimensions is 1.0 μm and also the standard minimum value of the gate interval is 1.0 μm so that the characteristic checking transistor according to this embodiment is formed in conformity with this value.

In the prior art where no dummy gate was provided, owing to the micro-loading effect, the gate electrode of the checking transistor had a different size from that in the product, and also the formation of self-aligned contact holes was not possible. On the other hand, in accordance with this embodiment, it is possible to realize a checking transistor, including the related interconnection layers, which is substantially equivalent to that of the regular transistor in the product so that the checking transistor can be truly representative of that in the product.

This concludes the explanation of the preferred embodiments, but the present invention is not limited to these embodiments. For example, in the embodiments, two dummy gates were formed on both sides of a gate electrode, but a single or three or more dummy gates may be formed. The functional element may be a p-channel MOS transistor, and may be a semiconductor device other than the MOS transistor.

As described above, the semiconductor device according to the present invention is provided with a characteristic checking element which can be representative of the regular element in a product and a dummy element(s) arranged on each of two sides of the characteristic checking element. For this reason, in accordance with the present invention, the characteristic checking element does not suffer from the micro-loading effect in lithography and etching which presented problems to the pattern standing alone in the prior art. Thus, a difference in size between the regular element in a product and a characteristic checking element can be decreased. As a result, the characteristic checking element can be more truly representative of the regular element in the product.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device having a characteristic checking element in addition to a regular functional element, said semiconductor device comprising at least one dummy non-functional element having a gate electrode in a floating state, which is identically arranged as the characteristic checking element and which is disposed at each of two sides of said characteristic checking element, said characteristic checking element and said dummy non-functional element respectively have gate electrodes which are identical to a gate electrode of said regular functional element in their gate electrode lengths and their density.

2. A semiconductor device according to claim 1, wherein said characteristic checking element is a MOS transistor.

3. A semiconductor device according to claim 1, which has contact holes self-aligned with said gate electrode of said characteristic checking element and said gate electrode of said dummy element.

* * * * *